United States Patent
Hamasaki et al.

(10) Patent No.: US 6,687,272 B2
(45) Date of Patent: Feb. 3, 2004

(54) SEMICONDUCTOR LASER DEVICE

(75) Inventors: Hiroshi Hamasaki, Hiratsuka (JP); Hideto Furuyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/244,386

(22) Filed: Sep. 17, 2002

(65) Prior Publication Data

US 2003/0053498 A1 Mar. 20, 2003

(30) Foreign Application Priority Data

Sep. 18, 2001 (JP) ........................ 2001-284074

(51) Int. Cl.[7] .............. H01S 3/04; H01S 5/00
(52) U.S. Cl. .............. 372/36; 372/50; 372/29
(58) Field of Search .............. 372/50, 36; 369/121, 369/112, 721

(56) References Cited

U.S. PATENT DOCUMENTS

| | | | | |
|---|---|---|---|---|
| 5,883,913 A | * | 3/1999 | Doi et al. | 372/50 |
| 5,903,529 A | * | 5/1999 | Nishi et al. | 369/44.23 |
| 5,920,587 A | * | 7/1999 | Narui et al. | 372/50 |
| 6,072,607 A | * | 6/2000 | Tajiri et al. | 359/15 |
| 6,091,689 A | * | 7/2000 | Taniguchi et al. | 369/112.21 |
| 6,282,006 B1 | * | 8/2001 | Tamada et al. | 359/173 |
| 6,449,296 B1 | | 9/2002 | Hamasaki et al. | |
| 6,504,812 B2 | * | 1/2003 | Taniguchi et al. | 369/121 |
| 2002/0060976 A1 | * | 5/2002 | Taniguchi et al. | 369/121 |
| 2002/0159379 A1 | * | 10/2002 | Fujioka et al. | 369/121 |

FOREIGN PATENT DOCUMENTS

| | | |
|---|---|---|
| JP | 4-332185 | 11/1992 |
| JP | 5-315700 | 11/1993 |
| JP | 8-321066 | 12/1996 |
| JP | 2881807 | 2/1999 |
| JP | 2001-15849 | 1/2001 |

OTHER PUBLICATIONS

Hiroharu Satoh, et al., "Fast Laser Power Control for High Density Optical Disk Systems", Proc. SPIE, Optical Data Storage, vol 1499, 1991, pp. 324–329.

* cited by examiner

Primary Examiner—Quyen Leung
Assistant Examiner—Hung T Vy
(74) Attorney, Agent, or Firm—Oblon, Spivak, McClelland, Maier & Neustadt, P.C.

(57) ABSTRACT

A semiconductor laser device comprising a mount substrate, a semiconductor laser element, and a total reflection mirror. The substrate includes an n-type Si substrate, an i-type Si layer deposited on a part of the Si substrate, and a p-type Si layer deposited on the Si layer. The Si substrate and Si layers constitute a pin photodiode. A part of the sides of the Si layers is a sloping surface. The laser element is mounted on the substrate and has a light-emitting surface opposing the sloping surface. The mirror is provided on a part of the sloping surface. It reflects and outputs a central part of a light beam emitted from the laser element. It guides the remaining part of the light beam to the photodiode.

21 Claims, 5 Drawing Sheets

SEMICONDUCTOR LASER DEVICE

CROSS-REFERENCE TO RELATED APPLICATIONS

This application is based upon and claims the benefit of priority from the prior Japanese Patent Application No. 2001-284074, filed on Sep. 18, 2001, the entire contents of which are incorporated herein by reference.

BACKGROUND OF THE INVENTION

1. Field of the Invention

The present invention relates to a semiconductor laser for use as a light source in optical communication and optical data recording.

2. Description of the Related Art

At present, semiconductor lasers are widely used as light sources in optical communication, optical data recording and similar fields. This is because they emit a coherent light beam, operate as high speed and can be made small. The semiconductor laser is sensitive to the ambient temperature. Its optical output well changes with the ambient temperature. To control the output of the semiconductor laser with high precision, the output light of the laser is monitored and subjected to feedback control in a drive current circuit. This method is called "automatic power control (APC)."

The output light of a semiconductor laser of edge emission type can be monitored, no matter whether it has been emitted from the front end or the rear end. Nonetheless, front APC is desirable, in which part of the light emitted from the front end of the laser is monitored.

Jpn. Pat. Appln. KOKAI Publication No. 4-232185 discloses an example of front APC using a semiconductor layer. In the APC disclosed in the publication, a light-sensitive element monitors that part of a beam that has not passed the effective area of the focusing lens, not a data-writing beam that has been emitted from a semiconductor laser and passed, in its entirety, through the effective area of the focusing lens. Thus, the APC can be performed without wasting any part of the data-writing beam. In the APC system disclosed in the publication, the semiconductor laser, the focusing lens, and the light-sensitive element are arranged and positioned independently of each other. Here arises a problem. Each component of the APC system must be positioned with high precision. This increases the manufacturing cost of the APC system.

Jpn. Pat. Appln. KOKAI Publication No. 2001-15849 discloses an APC system that solves this problem. This APC system comprises a mount substrate that is composed of an n-type Si substrate, an i-type Si layer provided on the n-type substrate, and a p-type Si layer provided on the i-type Si layer, each epitaxially grown. The substrate, i-type layer and p-type layer constitute a pin photodiode. The mount substrate has a recess made in one part. A semiconductor laser is mounted on the bottom of the recess. The recess has a sloping side. A half mirror covers a part of the sloping side. The half mirror is either a multi-layered dielectric film or a thin metal film. The half mirror reflects a part of the light emitted from the semiconductor laser. The light thus reflected travels upwards from the substrate. The other part of the light passes through the half mirror and is absorbed in the depletion layer that has developed in the i-type Si layer. The light absorbed changes to a photocurrent. The photocurrent is supplied to an APC circuit. In accordance with the photocurrent, the APC circuit controls the output of the semiconductor laser.

If the light emitted from the semiconductor laser is applied to an optical disk, it will be reflected and will travel back toward the semiconductor laser. Hereinafter, the light reflected and traveling back will be referred to as "optical feedback". In the APC system disclosed in Jpn. Pat. Appln. KOKAI Publication No. 2001-15849, a greater part of the optical feedback reflected from a half mirror, and the remaining part of the optical feedback reaches the light-receiving section of the photodiode, i.e., light monitoring means. More precisely, a part of the optical feedback is absorbed in the depletion layer existing near the i-type Si layer. The optical feedback absorbed in the depletion layer changes to a photocurrent. The photocurrent is added to the photocurrent generated from the light emitted from the semiconductor laser. The sum of these currents is input to the APC circuit. The optical feedback absorbed in the depletion layer results in a noise in the APC circuit. The noise makes a problem particularly when the APC circuit operates at high speed.

As indicated above, the conventional semiconductor laser device comprises mount substrate, a semiconductor laser and a light-sensitive element, both mounted on the same mount substrate. A part of the laser beam emitted from the semiconductor laser is applied to the light-emitting element via the half mirror. In this configuration, the optical feedback reflected from an optical disk or the like travels through the half mirror, inevitably reaching the light-sensitive element. This optical feedback becomes a noise in the APC circuit.

BRIEF SUMMARY OF THE INVENTION

An object of the present invention is to provide a semiconductor laser device mounted on the mount substrate, and a light-sensitive element also mounted on the mount substrate, and in which the light reflected from an optical disk or the like is prevented to reach the light-sensitive element, thereby greatly reducing noise during the use of an APC circuit.

According to the first aspect of the invention, there is provided A semiconductor laser device comprising: a semiconductor laser element, having a light-emitting surface, configured to emit a light beam from the light-emitting surface, the light beam including a central part and an another part; a mount structure configured to mount the semiconductor laser element, including a semiconductor substrate having a surface, and a semiconductor layer having a sloping surface opposed to the light-emitting surface and deposited on a part of the surface of the semiconductor substrate to form a light-sensitive element having a light-receiving section on a part of the sloping surface, the light-sensitive element configured to receive the another part of the light beam from the light-emitting surface; and a total reflection mirror provided on the sloping surface of the semiconductor layer and extending in a direction perpendicular to the direction in which the sloping surface is inclined, the total reflecting mirror configured to reflect the central part of the light beam and outputting the central part of the light beam outside the semiconductor laser device.

According to the second aspect of the invention, there is provided a mount structure comprising a semiconductor substrate having a recess to form a light-sensitive element, the recess provided in a part of the semiconductor substrate and having at least one sloping surface, and the light-sensitive element located outside the recess and having a light-receiving section at a part of the sloping surface; a semiconductor laser element mounted on a bottom surface of the recess and having a light-emitting surface which opposes the sloping surface; and a total reflection mirror provided on a part of the sloping surface, extending in a direction perpendicular to a direction in which the sloping surface is inclined and arranged to reflect and output a part of a light beam emitted from the semiconductor laser element, including at least a central part of the light beam, and to allow the remaining part of the light beam to reach the light-receiving section of the light-sensitive element.

According to the third aspect of this invention, there is provided a mount structure comprising a Si substrate having a main surface and doped with impurities of a first conductivity type in high concentration, a first Si layer provided on the main surface of the Si substrate and doped with impurities in low concentration and a second Si layer provided on the first Si layer and doped with impurities of a second conductivity type in high concentration, a sloping surface being formed at a side part of each of the first and second Si layers, the Si substrate having a trench on the side of the main surface, the trench having a surface that continues to the sloping surface; the Si substrate, the first Si layer and the second Si layer constituting a pin photodiode having a light-receiving surface located in the sloping surfaces; a semiconductor laser element mounted on the mount structure and having a light-emitting surface which opposes the sloping surfaces; and a total reflection mirror provided on the sloping surface and arranged to reflect and output a part of a light beam emitted from the semiconductor laser element, including at least a central part of the light beam, and to allow the remaining part of the light beam to reach the first Si layer, and having a slit-shaped opening made in the sloping surface and extending in a direction perpendicular to a direction in which the sloping surface is inclined.

DETAILED DESCRIPTION OF THE INVENTION

The present invention will be described in detail, with reference to several embodiments.

(First Embodiment)

Figure 1:
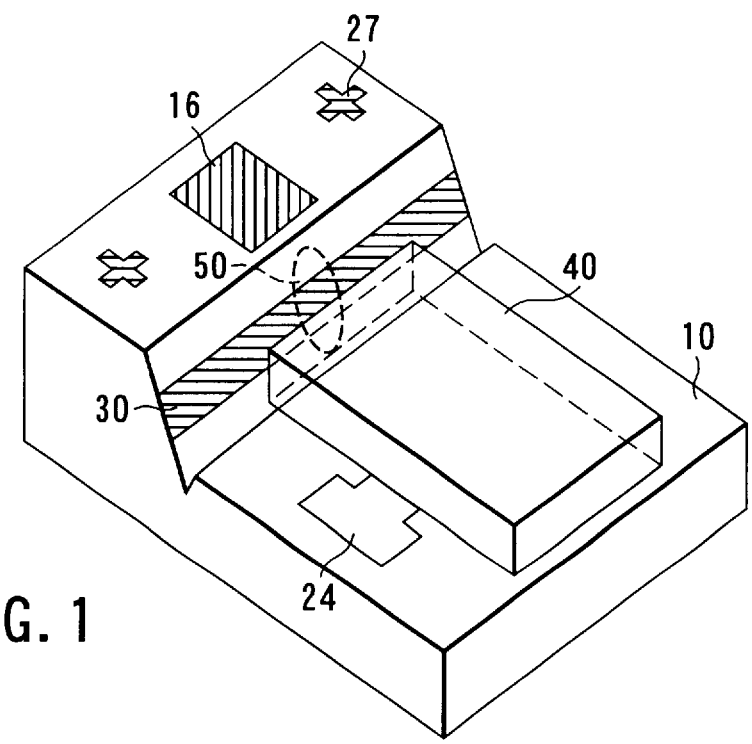
FIG. 1 is a perspective view showing a semiconductor laser device according to the first embodiment of the invention.
Figure 2:
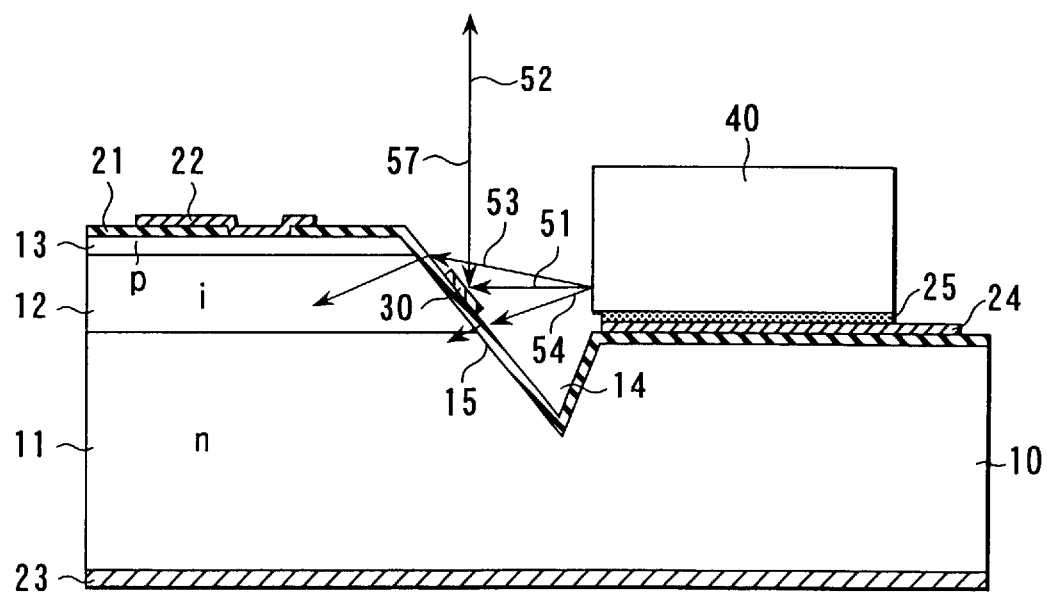
FIG. 2 is a sectional view depicting the semiconductor laser device according to the first embodiment.

FIGS. 1 and 2 are a schematic representation of a semiconductor laser device according to the first embodiment of the invention. More precisely, FIG. 1 is a perspective view and FIG. 2 is a sectional view.

As FIGS. 1 and 2 depict, the semiconductor laser device comprises a mount substrate 10, a total reflection mirror 30, and a semiconductor laser element 40. The mount substrate 10 comprises an n-type Si substrate 11 (Si substrate doped with impurities of first conductivity type in high concentration), an i-type Si layer 12 (Si layer doped with impurities in low concentration) provided on a part of the Si substrate 11, and a p-type Si layer 13 (Si layer doped with impurities of the second conductivity type in high concentration) provided on the i-type Si layer 12. The mount substrate 10 has been made by forming the Si layer 12 on the Si substrate 11 by epitaxial growth, then forming the Si layer 13 on the Si layer 12 by epitaxial growth, and removing parts of the Si layers 12 and 13 by means of anisotropic etching. The n-type Si substrate 11 and those parts of the i-type Si layer 12 and p-type Si layer 13 remaining on the substrate 11 constitute a pin photodiode that functions as a light-sensitive element.

An insulating layer is provided on the upper surface of mount substrate 10. The insulating layer 21 has one part removed at the p-type Si layer 13. A p-side electrode 22 is formed on the insulating layer 21 and the Si layer 13 that is exposed, not covered with the insulating layer 21. Thus, the p-side electrode 21 contacts the Si layer 13. An n-side electrode 23 is provided on the lower surface of the substrate 11. A reverse bias voltage may be applied between the electrodes 22 and 23, whereby a depletion layer develops in the entire i-type Si layer 12. The depletion layer is used as light-receiving section.

Those sides of the Si layers 12 and 13, which are exposed as the result of etching, define a sloping surface. Hence, the pin photodiode has a sloping side. Note that the sloping surface, which has been provided by anisotropic etching, is likely to be a (111) face.

The surface of substrate 11 is inclined at 9.7° to a (100) face so that the sloping surface 15 that will be a (111) face may be inclined at 45° to the surface of the substrate 11.

A total reflection mirror 30 is provided on the insulating layer 21 and lies above the sloping surface 15. To be more specific, the total reflection mirror 30 is provided on all he exposed, sloping side of the Si layer 12, except the upper and lower parts. The mirror 30 is shaped like a strip and made of Au, Ag or the like that exhibits high reflectivity to the wavelength of light applied to the mirror 30. In addition, a positioning marker 27 is formed on the top of the light-sensitive element. The positioning marker 27 may be one formed by etching the p-type Si layer 13. Alternatively, it may be a metal pattern provided on the insulating layer 21.

The mount substrate 10 has a recess, which has been made by removing parts of the Si layers 12 and 13. The semiconductor laser element 40, which is of face emission type, is mounted on the bottom of the recess. More precisely, an electrode 24 is formed on insulating layer 21, and the semiconductor laser element 40 is secured to the electrode 24 with electrically conductive adhesive 25 such as solder. Semiconductor laser element 40 is positioned with its light-emitting face opposed to the sloping surface 15.

A light beam emitted from semiconductor laser element 40 travels parallel to the surface of Si substrate 11. It is applied to the sloping surface 15, forming an elliptical beam spot 50 that extends in vertical direction. The central part 51 of the light beam is reflected by the total reflection mirror 30 provided on the sloping surface 15 and made of Au or the like and travels upwards as output light 52. The peripheral parts 53 and 54 of the light beam 51 enter the depletion layer developed in the i-type Si layer 12. They become a photocurrent in the depletion layer.

The upper and lower peripheral parts 53 and 54 of the light beam, shown in FIG. 2, correspond to the upper and lower parts of the beam spot 50 illustrated in FIG. 1. The parts 53 and 54 enter the light-receiving section and change to a monitoring current. The total reflection mirror 30 reflects the optical feedback 57 reflected by the optical disk or the like. The optical feedback 57 then travels back to the semiconductor laser element 40. It is desired that all optical feedback 57 be reflected by the total reflection mirror 30 and be prevented from entering the light-receiving section. To this end, the total reflection mirror 30 is made broader than the diameter of the spot that the optical feedback 57 forms on the sloping surface 15. This makes it possible to reduce the noise in the APC circuit. The diameter of the optical feedback 57 is determined by the numerical aperture (NA) and the like of the optical system used.

The light-receiving section of the light-receiving element for monitoring the light beam is the depletion layer formed at almost the same position as the i-type Si layer 12. The position where the semiconductor laser element 40 is mounted is determined by the depth of the recess made in the mount substrate 10. The depth of the recess made in the mount substrate 10 can be controlled by adjusting the time of anisotropy etching. Hence, the height of the light-receiving region and the height of the semiconductor laser element 40 can be precisely adjusted relative to each other, by controlling the anisotropy etching time. The positioning marker 27 shown in FIG. 2 is used, precisely determining the positions of the light-receiving region, total reflection mirror 30 and electrode 24 supporting the semiconductor laser element 40. No special positioning step needs to be carried out to arrange the components at desired positions.

The height that light-emitting section has with respect to the light-receiving region is determined by the position of the active layer of the semiconductor layer 40 and the depth of the recess made in the mount substrate 10. In other words, the light-emitting section can have a desired height since the section is formed by a process, such as etching and crystal growth, which can be performed with high precision. On the other hand, the semiconductor laser element 40 is arranged on the electrode 24, not so precisely in the horizontal direction. Usually, a displacement of ±5 to 10 μm is inevitable. This is because the positional precision of the laser element 40 depends on the positional precision of the jig used to mount the laser element 40. A jig of higher positional precision may be used to mount the laser element 40, in order to reduce the displacement to ±1 μm or less. If such a jig is utilized, however, it will take a longer time to mount the semiconductor laser element 40. This would raise the manufacturing cost of the semiconductor laser device. The beam spot that the light beam forms on the sloping surface 15 has a diameter of about 20 μm when the beam has a diversion angle of 22° and the distance of 50 μm between the light-emitting face and the sloping surface 15. Therefore, the horizontal displacement of the semiconductor laser element 40 cannot be neglected so long as the positional precision of the other components are of ordinary values.

The structure for confining light in the active layer of the semiconductor laser element 40 is firm and tight in the vertical direction in which crystal has grown. Therefore, the angle at which the light beam diverges would be little changed, irrespective of the value of the current supplied to the semiconductor laser device. However, the light-confining structure cannot confine light in the active layer of semiconductor laser element 40 so readily in the horizontal direction as in the vertical direction. The degree of confining light in the horizontal direction is inevitably much influenced by changes in the current distribution which occur as the current supplied to the laser device changes. Consequently, the angle at which the light beam diverges in the horizontal direction greatly changes in accordance with the current supplied to the device.

In the present embodiment, the total reflection mirror 30 is shaped like a strip that extends in the horizontal direction. So shaped, the mirror 30 serves to minimize the change in the monitoring current that results from the horizontal displacement of the semiconductor laser element 40 and the change in the diverging angle of the light beam. In other words, the strip-shaped, total reflection mirror 30 can suppress the change in the monitoring current, which has been caused by the horizontal displacement of the semiconductor laser element 40 and the change in the diverging angle of the light beam.

As seen from FIG. 2, a trench 14 is made in the surface of the Si substrate 10. The trench 14 is continuous to the sloping surface 15, i.e. the inclined side of the light-sensitive element. Thanks to the trench thus positioned, the light beam emitted from the laser element 40 is not reflected from the bottom of the recess even if the light-emitting section (i.e., active layer) of the laser element 40 lies relatively near the bottom of the recess. A method of manufacturing the semiconductor laser device having the structure shown in FIGS. 1 and 2 will be explained.

First, a wafer is prepared, which comprises an n-type Si substrate 11, an i-type Si layer 12 epitaxially formed on the substrate 11, and p-type Si layer 13 epitaxially formed on the i-type Si layer 12. On this wafer, a pattern, such as a thermally oxidized film or a nitride film, is formed on the wafer by mans of photolithography or the like. Using the pattern as mask, etchant such as KOH is applied into the recess, thus performing etching until the substrate 11 is exposed in the recess.

Then, a pattern, such as a thermally oxidized film or a nitride film, is formed on the exposed part of the substrate 11 by means of photolithography or the like. Using this pattern as mask, etching is performed on the substrate 11. A trench 14 is thereby made. The etchant such as KOH is an anisotropic etchant. The recess has sloping surfaces that are specific crystal face such as (111) faces. The sloping surfaces are therefore flat.

Thereafter, a dielectric film (insulating layer) 21 such as an oxide film is formed on the sloping surface 15, Si layer 13, and substrate 11 to achieve passivation and insulation. An Au film is then formed on the dielectric film 21 formed on the sloping surface 15, providing a total reflection mirror 30, by means of ordinary photolithography or ordinary lift-off process. The total reflecting mirror 30 is subjected to etching, exposing a part of the i-type Si layer 12 at the sloping surface 15. Electrodes 22 for a photodiode and a back electrode 23 are formed. Finally, dicing is carried out, cutting the semiconductor laser device from the wafer, in the form of a chip.

In this embodiment, the light-sensitive element is formed integral with the subs-mount substrate 10 that supports the semiconductor laser element 40. Of the light beam emitted from the semiconductor laser element 40, the central part is output by using the total reflecting mirror 30, and the peripheral part is detected by the light-sensitive element. That is, the total reflection mirror 30, not a half mirror, reflects only the central part of the light beam emitted from the semiconductor laser element 40.

The central part of the light beam is output from the semiconductor laser device, whereas the peripheral part of the beam is applied to the light-sensitive element that functions as a light monitoring means. The total reflection mirror 30 receives all of the optical feedback reflected from an optical disk or the like. None of the optical feedback reflected from the disk or the like is applied to the light-sensitive element. In the present embodiment, the optical feedback reflected from the optical disk or the like would not reach the light-sensitive element functioning as monitoring means. This greatly reduces the noise in the APC circuit, even if the APC circuit operates at high speed.

Further, the positional relation of semiconductor laser element 40 and total reflection mirror 30 can be set with sufficient precision when the semiconductor laser device is manufactured by the ordinary method. Therefore, neither special apparatuses nor special control processes are required to manufacture the semiconductor laser device shown in FIGS. 1 and 2. This lowers the manufacturing cost of the semiconductor laser device. The thickness and other physical properties of the dielectric film 21 may be adjusted so that the film 21 may reflect no light. In this case, the reflection of light to be monitored can be suppressed. This enhances the monitoring efficiency and reduces stray light.

(Second Embodiment)

Figure 3:
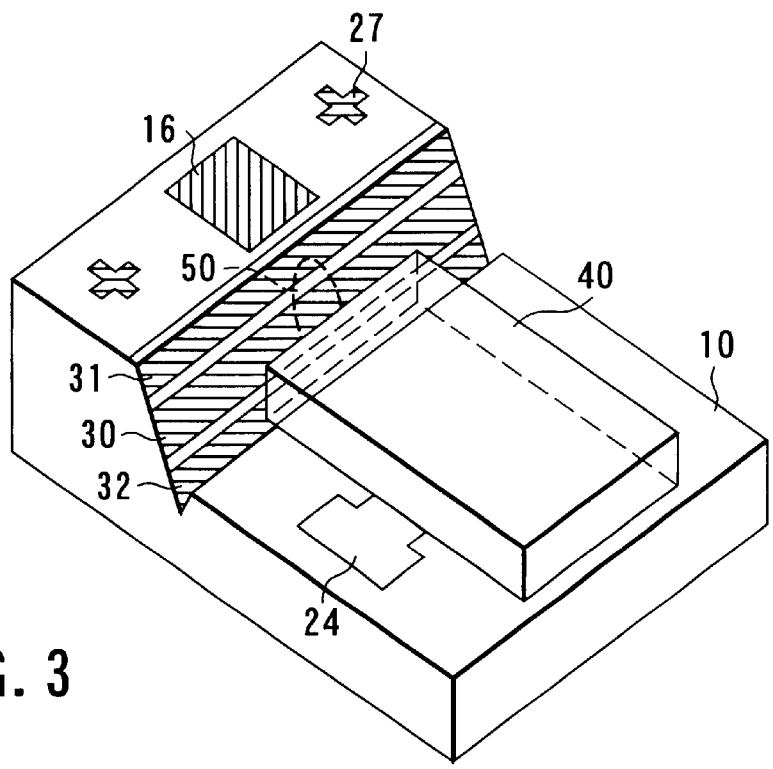
FIG. 3 is a schematic perspective view illustrating a semiconductor laser device according to the second embodiment of this invention.
Figure 4:
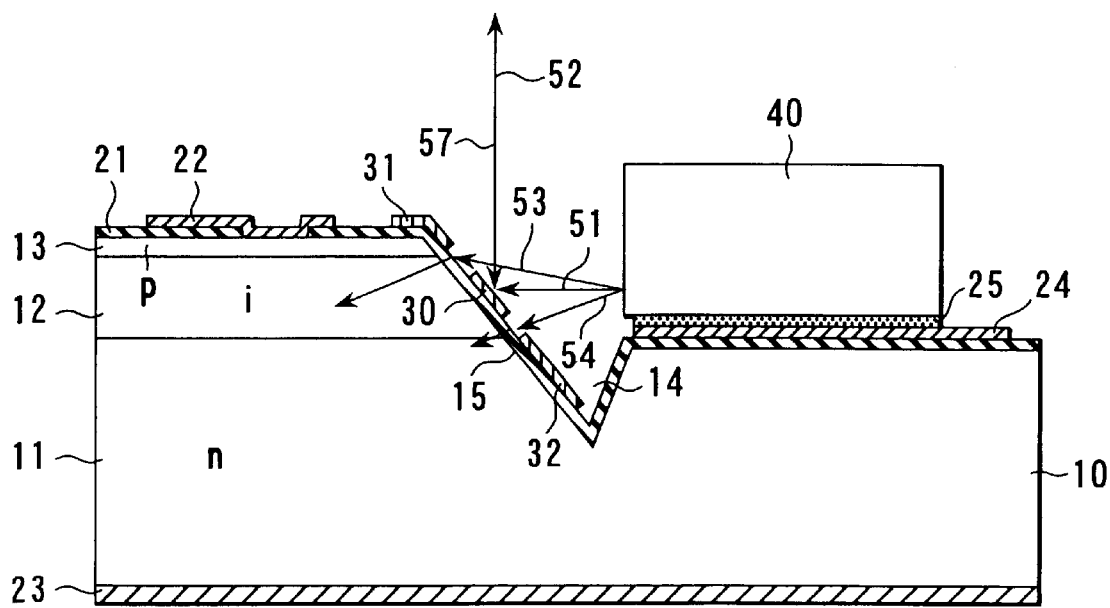
FIG. 4 is a sectional view depicting the semiconductor laser device according to the second embodiment.

FIGS. 3 and 4 are a schematic representation of a semiconductor laser device according to the second embodiment of this invention. FIG. 3 is a perspective view, and FIG. 4 is a sectional view. The components identical to those of the first embodiment shown in FIGS. 1 and 2 are designated at the same reference numerals, and will not be described in detail.

The second embodiment is identical in basic structure to the first embodiment. It differs from the first embodiment in the position of the total reflection mirror. As FIGS. 3 and 4 show, a total reflection mirror 30, shaped like a strip, is provided, covering a part of the i-type Si layer 12 as in the first embodiment. In addition, another strip-shaped, total reflection mirror 31 is provided, covering the p-type Si layer 13 exposed at the sloping surface 15, and still another strip-shaped, total reflection mirror 32 is provided, covering the n-type Si substrate 11 exposed to at the sloping surface 15. In other words, the three total reflection mirrors constitute a mirror laid on the sloping surface 15, which has slits. Through the slits, the upper and lower parts of the i-type Si layer 12 are exposed at the sloping surface 15.

So arranged and positioned, the total reflection mirrors 31, 32 and 33 prevent light from being absorbed into the n-type Si substrate 11 and p-type Si layer 13. Since no light is absorbed into the n-type Si substrate 11 or the p-type Si layer 13, no electric current is generated or flows into the i-type Si layer 12. Hence, there is no current component (so-called "tail of the wave received") of low frequency response. Therefore, the second embodiment can not only achieve the same advantage as the first embodiment, but also can fast respond to the input current.

Reference Example

Figure 5:
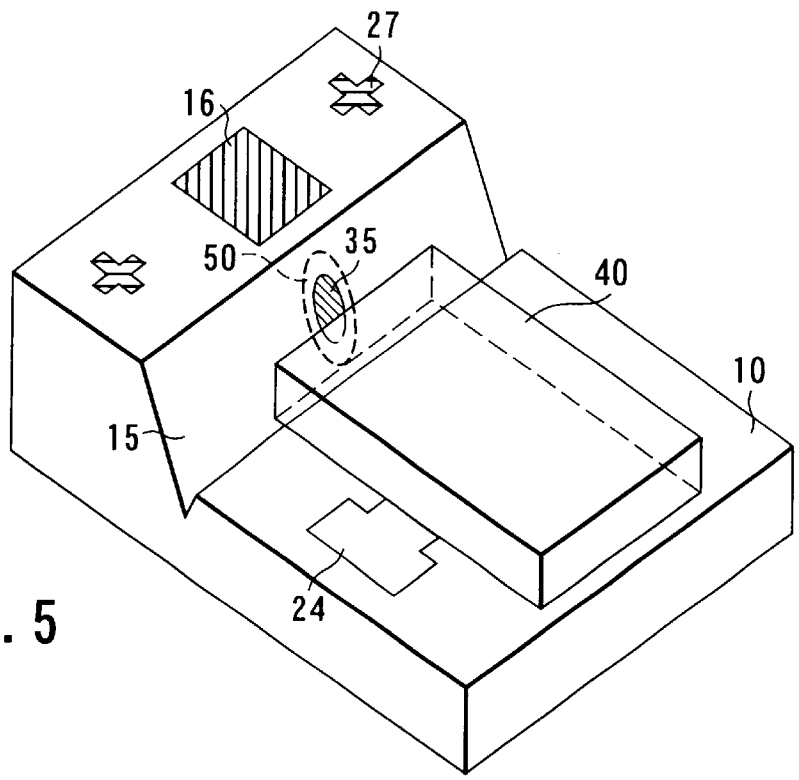
FIG. 5 is a schematic perspective view showing a semiconductor laser device according to the reference example of the present invention.

FIG. 5 is a perspective view showing a semiconductor laser device according to the reference example of the invention. The components identical to those shown in FIG. 1 are designated at the same reference numerals and will not be described in detail.

The reference example is identical in basic structure to the first embodiment. It differs from the first embodiment in the shape and position of the total reflection mirror. As FIG. 5 depicts, the total reflection mirror 35 is elliptical, not strip-shaped as in the first embodiment. The center of the mirror 35 coincides with the axis of the light beam emitted from the semiconductor laser element 40. Since the mirror 35 is so shaped and positioned, the left and right parts of the sloping surface 15 can serve as light-receiving regions.

However, the light-receiving efficiency will be negatively influenced if the semiconductor laser element 40 is much displaced in the horizontal direction. Hence, the laser element 40 must be positioned in the horizontal direction more precisely than in the first and second embodiments.

(Third Embodiment)

Figure 6:
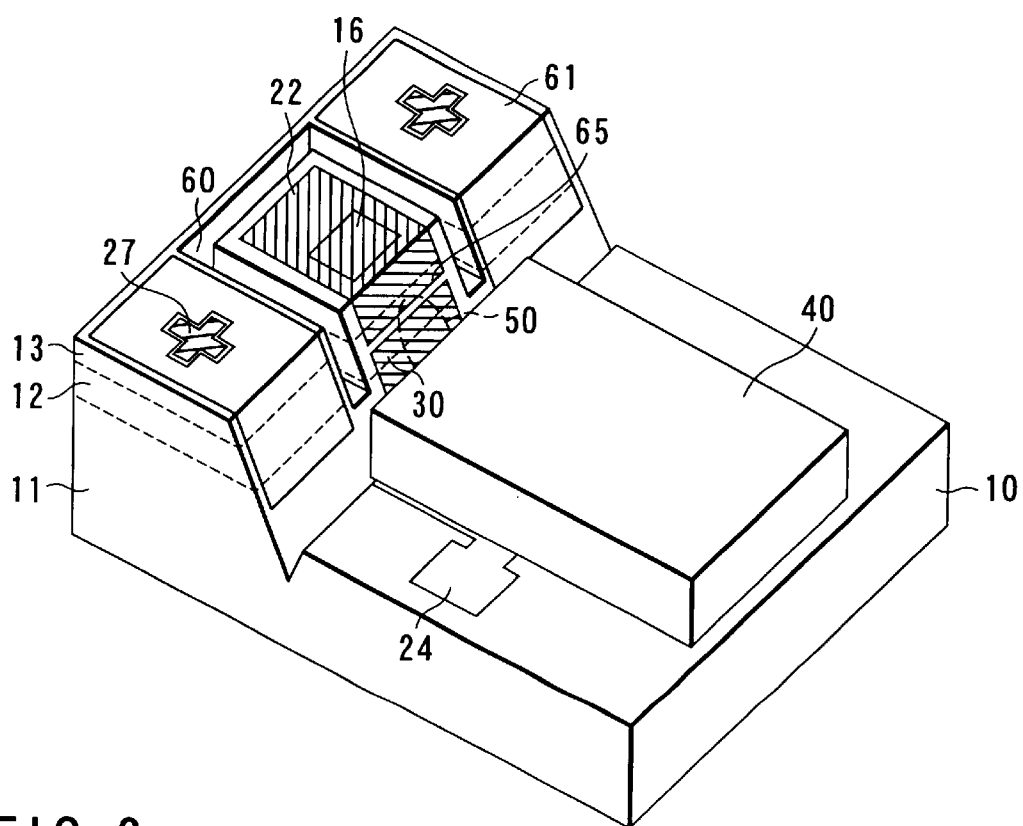
FIG. 6 is a schematic perspective view showing the semiconductor laser device affecting the third embodiment of the invention.
Figure 7:
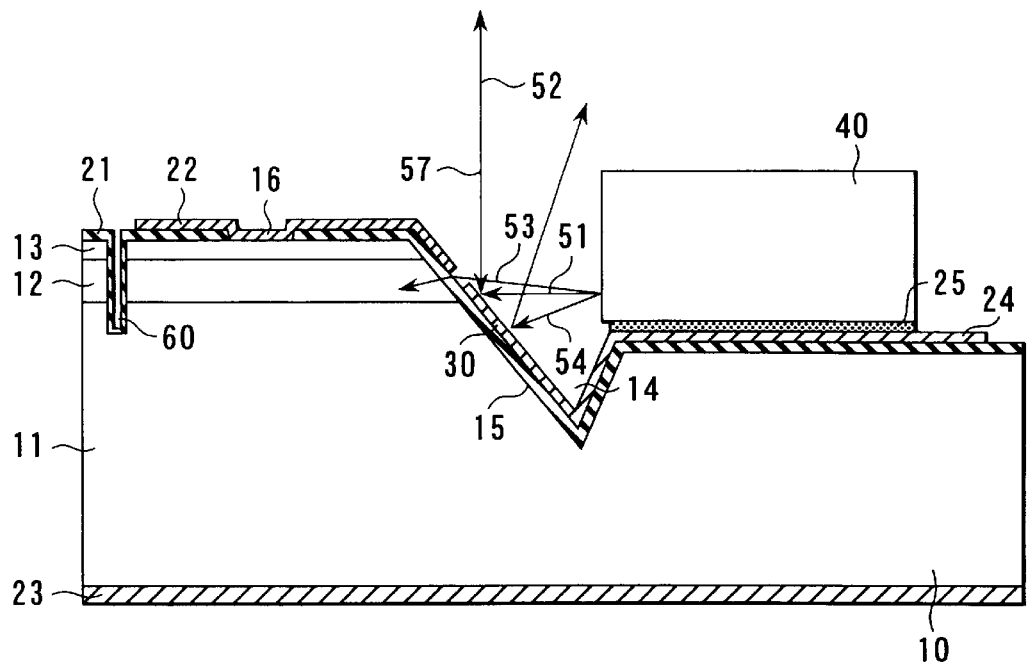
FIG. 7 is a sectional view which depicting the semiconductor laser device affecting the third embodiment.

FIGS. 6 and 7 show a semiconductor laser device according to the third embodiment of the invention. FIG. 6 is a perspective view, and FIG. 7 is a sectional view. The components identical to those shown in FIGS. 1 and 2 are denoted at the same reference numerals and will not be described in detail.

The third embodiment is identical to the first embodiment in basic structure. It differs from the first embodiment in the structure of the light-receiving section and that of the total reflection mirror 30. To be more specific, an isolation trench 60 is made in the i-type Si layer 12 and p-type Si layer. The trench 60 reaches the Si substrate 11. The trench 60 isolates those parts of the layers 12 and 13, which function as a light-sensitive element, from any other parts of the Si layers 12 and 13.

The light beam emitted from the semiconductor laser element 40 forms an elliptical spot 50 when it reaches the sloping surface 15. The part of the surface 15, which is not illuminated by the beam spot 50, is unnecessary for the light-sensitive element. The smaller this part, the better, since the static capacitance of the light-sensitive element is determined by the surface area of its depletion layer. In the third embodiment, the unnecessary part of the sloping surface 15 is minimized. The third embodiment can, therefore, operate at high speed.

The trench 60 that isolates the light-sensitive element is cut in the Si layers 12 and 13. Thus, the light-sensitive element would not be cut when the wafer is diced, cutting the semiconductor laser chip from the wafer. Hence, no broken layers are exposed at any side or surface of the laser device cut out by dicing, and the leakage current of the light-sensitive element would not increase at all. In addition, no metal layers will exfoliated from the chip or will stick to any exposed side of the chip to cause short-circuiting. This is because neither the electrode 24 nor the total reflection mirror 30 is diced at all.

In most photolithography processes, the upper surface of the structure is coated with a resist and light is applied to the resist through a patterned mask, thereby forming a resist pattern. If the structure has a narrow trench, the resist has a thickness on the top of the structure and a different thickness on the bottom of the groove, due to the flow of the resist material. As a consequence, light should be applied to the top of the structure in one condition, and to the bottom of the groove in another condition. Photolithography can hardly be accomplished in a desired manner. In the third embodiment, the total reflection mirror 30 is formed integral with the electrode 24, and the trench 14 is therefore broad, not narrow. Photolithography can be performed as is desired.

The electrode 22 of the light-sensitive element lies on the flat top and the upper part of the sloping surface 15. The lower edge of the electrode 22 is at almost the center part of the i-type Si layer 12. The electrode 22 therefore shields light from that part of the p-type Si layer 13 that is not depleted at all. This prevents the generation of a current of low response when the semiconductor laser device operates at high speed. Additionally, a slit 65 is cut in the sloping surface 15, near the upper edge of the total reflection mirror 30. The slit 65 is so positioned as to be irradiated with only the peripheral part of the light beam emitted from the semiconductor laser element 40.

Figure 8:
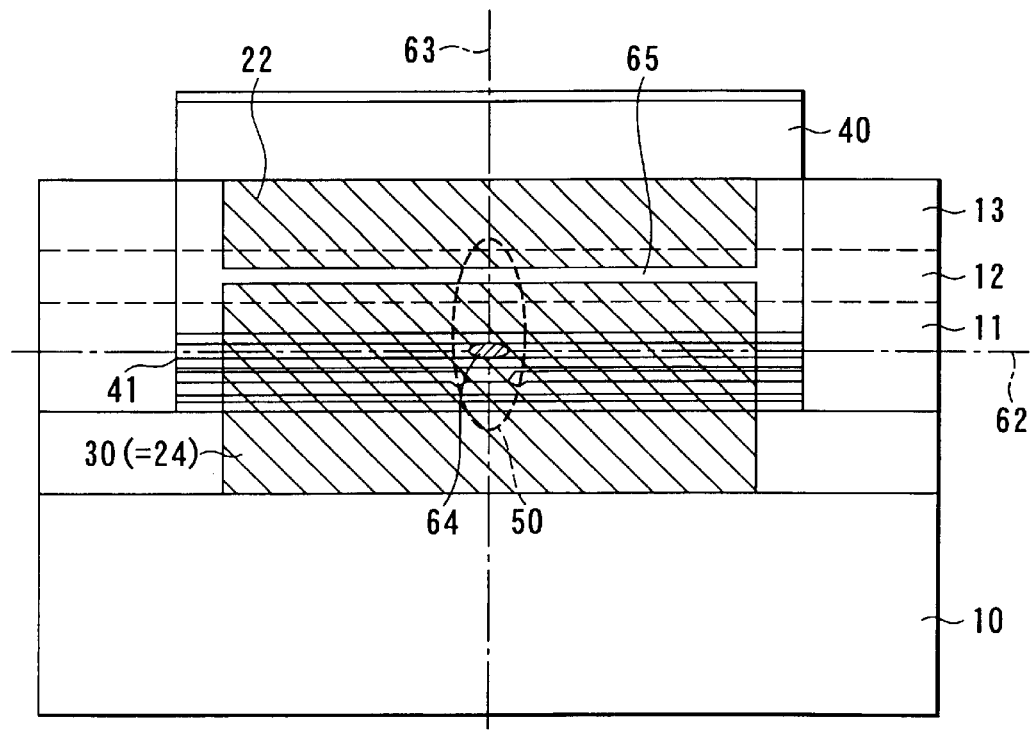
FIG. 8 is a side view of the semiconductor laser device according to the third embodiment, displaying the positional relation the components have as viewed from the light-emitting side.

FIG. 8 illustrates the positional relation that the components of the laser device have when the device is viewed from the light-emitting side. As seen from FIG. 8, the semiconductor laser element 40 has an active layer 41 and a light-emitting section 64. The light-emitting section 64 has a horizontal axis 62 and a vertical axis 63. The intersection of the axis 62 and 63 lies almost at the center of the light emitting section 64. Generally, AlGaInP lasers and AlGaAs lasers for use in optical disk drives, such as DVD drive and CD drives, generate an ever-increasing output. To radiate heat efficiently, they have a junction-down mount structure in which various components are amounted on the surface of the active layer. Therefore, the active layer 41 lies at about 5 to 10 μm above the recess made in the mount substrate in the third embodiment.

The slit 65 made in the electrode 22 and 24 is located near the center of the i-type Si layer 12 and is remote from the axis of the light beam emitted from the semiconductor laser element 40. The central part of the light beam is reflected by the total reflection mirror 30 and output from the semiconductor laser device. The optical feedback reflected from an optical disk or the like is also applied to the total reflection mirror 30 and will not enter the light-sensitive element. The output of the light-sensitive element therefore functions as a monitored output light that is not influenced by the optical feedback.

As FIG. 6 shows, a metal mask 61 is provided to prevent stray light from entering into any part other than the light-sensitive element to generate electric carriers. Note that such carriers may diffuse and may become a current that would results in a noise.

The third embodiment achieves not only the same advantage as the first embodiment, but also the following advantage. Since the isolation trench 60 is made in the Si layers 12 and 13, thus providing the light-sensitive element at minimum size required. The light-sensitive element can therefore operate at high speed. Moreover, the leakage current of the light-sensitive element does not increase since no broken layers are exposed when the laser device is cut from the wafer. In addition, no metal layers are exfoliated from the chip or will stick to the exposed side of the chip to cause short-circuiting. Further, the trench 14 can be made easily, because it need not have a complex shape.

(Fourth Embodiment)

Figure 9:
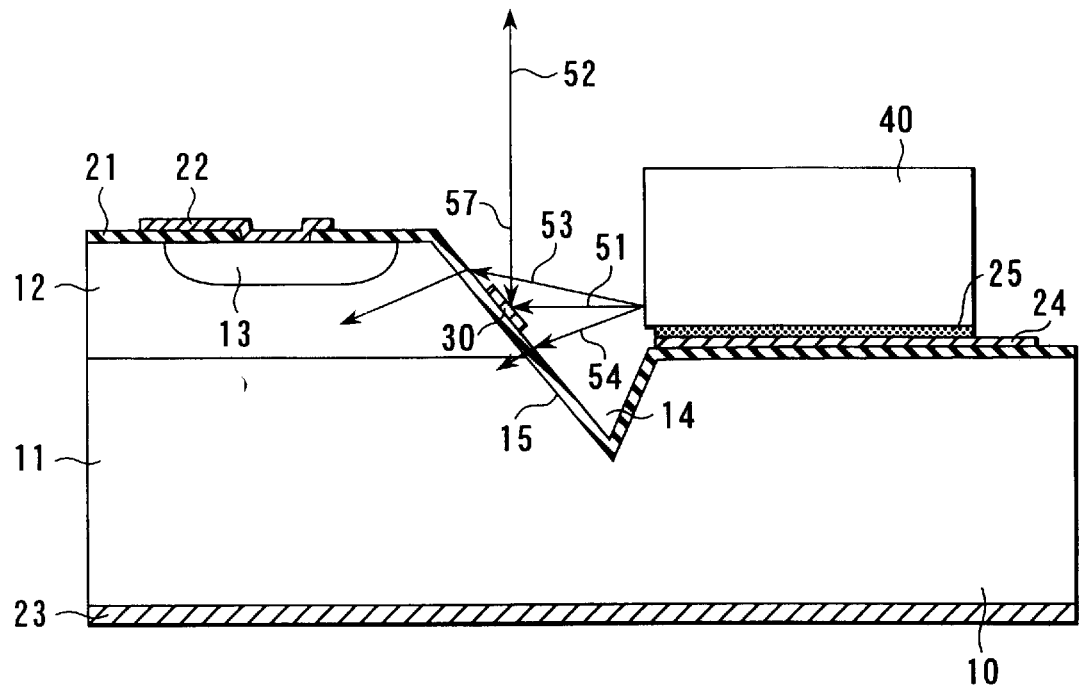
FIG. 9 is a sectional view of a semiconductor laser device according to the fourth embodiment of this invention.

FIG. 9 is a sectional view of a semiconductor laser device according to the fourth embodiment of this invention. The components identical to those shown in FIG. 2 are designated at the same reference numerals and will not be described in detail.

The fourth embodiment is different from the first embodiment in that the p layer of the pin diode is formed by impurity diffusion.

The mount substrate 10 comprises an n-type Si substrate 11 and an i-type Si layer 12 deposited on the substrate 11. The substrate 11 has a high impurity concentration, while the Si layer 12 has a low impurity concentration. The mount substrate 10 has a recess made by removing a part of the substrate 10. A part of the i-type Si layer 12 has been removed from the n-type Si substrate 11, by means of anisotropic etching or the like. A p-type Si layer 13 is provided on a part of the Si layer 12 remaining on the n-type Si substrate 11. The i-type Si layer 12, p-type Si layer 13 and n-type Si substrate 11 constitute a pin photodiode (light-sensitive element).

The fourth embodiment, thus constructed, has not only the same advantage as the first embodiment, but also the following advantage. Since the p-type Si layer 13 is not exposed at the sloping surface 15, no light is applied to that part of the Si layer 13 that is noted depleted. This prevents the generation of a current of low response when the semiconductor laser device operates at high speed. Further, since the i-type Si layer 12 has a large light-receiving surface, it is more sensitive to light than otherwise.

(Fifth Embodiment)

Figure 10:
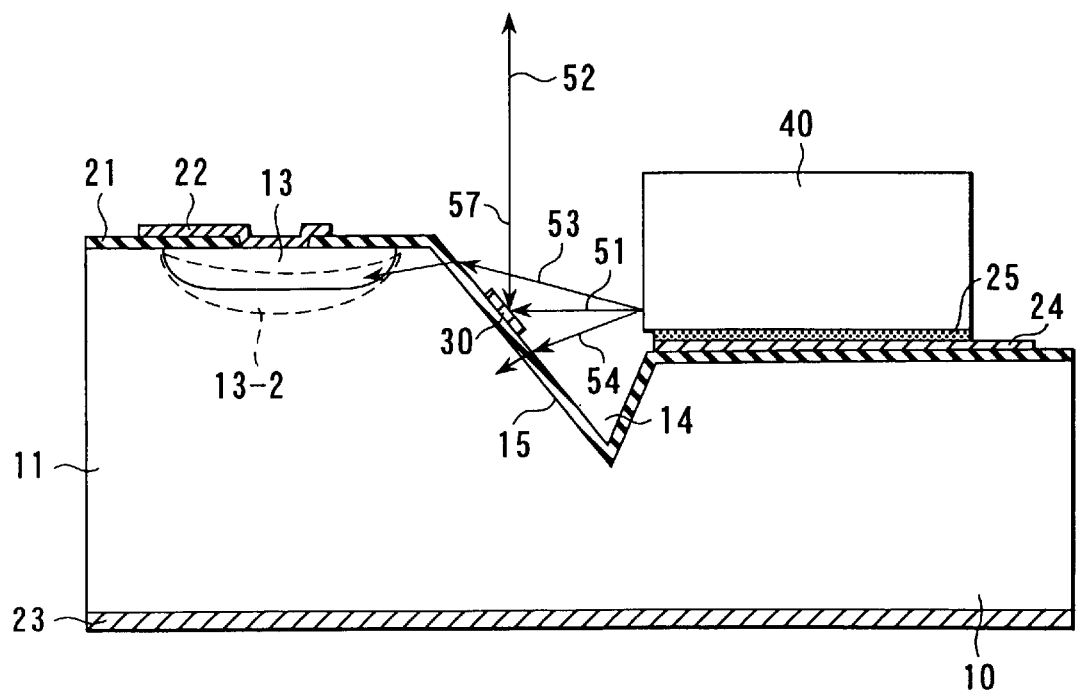
FIG. 10 is a sectional view of a semiconductor laser device according to the fifth embodiment of the present invention.

FIG. 10 is a sectional view of a semiconductor laser device according to the fifth embodiment of the present invention. The components identical to those shown in FIG. 2 are designated at the same reference numerals and will not be described in detail.

The fifth embodiment differs from the first embodiment in that a pn photodiode is provided, instead of a pin photodiode.

The mount substrate 10 comprises an n-type Si substrate 11 and a p-type Si layer 13. Both the Si substrate 11 and the Si layer 13 have high impurity concentration. The Si substrate 11 has a recess made by removing a part of the substrate 11 by anisotropic etching or the like. The Si layer 13 is provided on the remaining part of the Si substrate 11. The p-type Si layer 13 and the n-type Si substrate 11 constitute a pn photodiode. The pn photodiode functions as a light-sensitive element.

When a reverse bias voltage is applied to the pn photodiode, a depletion layer 13-2 develops at a position near the interface between the p-type Si layer 13 and the n-type Si substrate 11. The depletion layer 13-2 operates as light-receiving section.

The depletion layer cannot be as thick as in the pin photodiode used in the first embodiment at the same reverse bias voltage. Inevitably, the depletion layer is not so sensitive to light as the depletion layer developed in the pin photodiode, and hence has but low frequency-response. Nonetheless, the use of a pn photodiode, which is less expensive than the pin photodiode, helps to reduce the manufacturing cost of the mount substrate 10.

(Modifications)

The present invention is not limited to the embodiments set forth above. In the embodiments, the mount substrate 10 is made of silicon (Si). Nevertheless, the mount substrate may be made of any other material that can provide a light-sensitive element capable of receiving the light emitted from the semiconductor laser used and having a specific wavelength, and can be subjected to etching, such as anisotropic etching, to provide a flat sloping surface. The mount substrate may be made of, for example, GaAs.

Moreover, the conductivity of the Si substrate 11 may be p type, not n type as in the embodiments described above. If the substrate 11 is an n-type one, the same advantage can be attained only if each of the other components of the mount substrate 10 has the opposite conductivity type.

Additional advantages and modifications will readily occur to those skilled in the art. Therefore, the invention in its broader aspects is not limited to the specific details and representative embodiments shown and described herein. Accordingly, various modifications may be made without departing from the sprint or scope of the general inventive concept as defined by the appended claims and their equivalents.

What is claimed is:

1. A semiconductor laser device comprising:
   a semiconductor laser element, having a light-emitting surface, configured to emit a light beam from the light-emitting surface, the light beam including a central part and an another part;
   a mount structure configured to mount the semiconductor laser element, including a semiconductor substrate having a surface, and a semiconductor layer having a sloping surface opposed to the light-emitting surface and deposited on a part of the surface of the semiconductor substrate to form a light-sensitive element having a light-receiving section on a part of the sloping surface, said light-sensitive element configured to receive the another part of the light beam from the light-emitting surface; and
   a total reflection mirror provided on the sloping surface of the semiconductor layer and extending in a direction perpendicular to the direction in which the sloping surface is inclined, said total reflecting mirror positioned vertically on the sloping surface to reflect and output the central part of the light beam while allowing the another part of the light beam to enter the semiconducting layer.

2. A semiconductor laser device according to claim 1, wherein the semiconductor substrate is doped with impurities of a first conductivity type in high concentration; the semiconductor layer comprises a first semiconductor layer provided on the semiconductor substrate and doped with impurities in low concentration and a second semiconductor layer provided on the first semiconductor layer and doped with impurities of a second conductivity type in high concentration; and the semiconductor substrate and the first and second semiconductor layers constitute a pin photodiode functioning as the light-sensitive element.

3. A semiconductor laser device according to claim 2, wherein the total reflection mirror covers part of a side surface of the first semiconductor layer which lies at the sloping surface.

4. A semiconductor laser device according to claim 2, wherein the total reflection mirror comprise a first strip-shaped pattern.

5. A semiconductor laser device according to claim 4, wherein the total reflection mirror further comprises a second strip-shaped pattern spaced apart form the first strip-shaped pattern and defining a gap which is located at a part of the first semiconductor layer.

6. A semiconductor laser device according to claim 2, wherein the semiconductor substrate has a trench on the side of the main surface and a surface of said trench continues to the sloping surface of the semiconductor layer; the total reflection mirror has a first strip-shaped pattern, a second strip-shaped pattern, and a third strip-shaped pattern, said first strip-shaped pattern covering part of a side surface of the first semiconductor layer which lies at the sloping surface, said second strip-shaped pattern covering a side surface of the second semiconductor layer which lies at the sloping surface, and said third strip-shaped pattern covering the surface of said trench which continues to the sloping surface; and the first, second and third strip-shaped patterns extend parallel to each other in a direction perpendicular to a direction in which the sloping surface is inclined.

7. A semiconductor laser device according to claim 1, wherein the semiconductor substrate is doped with impurities of a first conductivity type in high concentration; the semiconductor layer is doped with impurities in low concentration; a semiconductor layer doped with impurities of a second conductivity type in high concentration is provided on a surface of the semiconductor layer of low impurity concentration; and the semiconductor substrate, semiconductor layer of low impurity concentration and semiconductor layer of high impurity concentration constitute a pin photodiode functioning as the light-sensitive element.

8. A semiconductor laser device according to claim 7, wherein the total reflection mirror covers part of a side surface of the semiconductor layer of low impurity concentration, which lies at the sloping surface.

9. A semiconductor laser device according to claim 7, wherein the total reflection mirror has a slit-shaped opening which extends in a direction perpendicular to a direction in which the sloping surface is inclined, and the slit-shaped opening is located at a part of the semiconductor layer of low impurity concentration.

10. A semiconductor laser device according to claim 1, wherein a non-reflecting film is provided on the sloping surface.

11. A semiconductor laser device according to claim 1, wherein the semiconductor substrate has
   a trench on the side of the main surface an a surface of said trench continues to the sloping surface of the semiconductor layer.

12. A semiconductor laser device according to claim 1, wherein the semiconductor substrate and the semiconductor layer are made of silicon.

13. A semiconductor laser device according to claim 12, wherein the sloping surface of the semiconductor layer is a (111) face, and the surface of the semiconductor substrate is inclined to a (100) face by a predetermined angle, whereby the sloping surface is inclined at 45° to the surface of the semiconductor substrate.

14. A semiconductor laser device comprising:
   a mount structure comprising a semiconductor substrate having a recess to form a light-sensitive element, said recess provided in a part of said semiconductor substrate and having at least one sloping surface, and said light-sensitive element located outside the recess and having a light-receiving section at a part of the sloping surface;
   a semiconductor laser element mounted on bottom surface of the recess and having a light-emitting surface which opposes the sloping surface; and
   a total reflection mirror provided on a part of the sloping surface, extending in a direction perpendicular to a direction in which the sloping surface is inclined and arranged to reflect and output a part of a light beam emitted from the semiconductor laser element, including at least a central part of the light beam, and to allow a remaining part of the light beam to reach the light-receiving section of the light-sensitive element.

15. A semiconductor laser device according to claim 14, wherein the total reflection mirror has a slit-shaped opening which extend in a direction perpendicular to a direction in which the sloping surface is inclined, and at least part of the slit-shaped opening is located at the light-receiving section of the light-sensitive element.

16. A semiconductor laser device according to claim 14, wherein a non-reflecting film is provided on the sloping surface.

17. A semiconductor laser device according to claim 14, wherein the semiconductor substrate has a trench on the side of the bottom surface of the recess and a surface of the trench continues to said at least one sloping surface of the recess.

18. A semiconductor laser device according to claim 14, wherein the semiconductor substrate is made of silicon (Si).

19. A semiconductor laser device according to claim 18, wherein the sloping surface of the recess made in the semiconductor substrate is a (111) face, and the bottom surface of the recess is inclined to a (100) face by a predetermined angle, whereby the sloping surface is inclined at 45° to the bottom surface of the recess.

20. A semiconductor laser device comprising:

a mount structure comprising a Si substrate having a main surface and doped with impurities of a first conductivity type in high concentration, a first Si layer provided on the main surface of the Si substrate and doped with impurities in low concentration and a second Si layer provided on the first Si layer and doped with impurities of a second conductivity type in high concentration, a sloping surface being formed at a side part of each of said first and second Si layers, said Si substrate having a trench on the side of the main surface, said trench having a surface that continues to the sloping surface; said Si substrate, said first Si layer and said second Si layer constituting a pin photodiode having a light-receiving surface located in the sloping surfaces;

a semiconductor laser element mounted on the mount structure and having a light-emitting surface which opposes the sloping surface; and a total reflection mirror provided on the sloping surface and arranged to reflect and output a part of a light beam emitted from the semiconductor laser element, including at least a central part of the light beam, and to allow a remaining part of the light beam to reach the first Si layer, and having a slit-shaped opening made in the sloping surface and extending in a direction perpendicular to a direction in which the sloping surface is inclined.

21. A semiconductor laser device according to claim 20, wherein the total reflection mirror comprises a plurality of strip-shaped patterns which extend in a direction perpendicular to a direction in which the sloping surface is inclined, and gaps are defined between the strip-shaped patterns.

* * * * *